United States Patent
Ohba et al.

(12) 
(10) Patent No.: US 6,670,101 B2
(45) Date of Patent: Dec. 30, 2003

(54) TOUGHENED BENZOCYCLOBUTENE BASED POLYMERS AND THEIR USE IN BUILDING-UP PRINTED WIRING BOARDS

(75) Inventors: Kaoru Ohba, Mishima (JP); Hideki Akimoto, Susono (JP); Philip E. Garrou, Cary, NC (US); Ying-Hung So, Midland, MI (US); Britton Lee Kaliszewski, Saginaw, MI (US)

(73) Assignee: Dow Global Technologies Inc., Midland, MI (US)

( * ) Notice: Subject to any disclaimer, the term of this patent is extended or adjusted under 35 U.S.C. 154(b) by 58 days.

(21) Appl. No.: 10/043,839

(22) Filed: Jan. 10, 2002

(65) Prior Publication Data

US 2002/0102494 A1 Aug. 1, 2002

Related U.S. Application Data

(62) Division of application No. 09/496,495, filed on Feb. 2, 2000, now Pat. No. 6,420,093.

(51) Int. Cl.[7] .............................. G03C 5/00; C08F 2/46
(52) U.S. Cl. ................. 430/311; 430/281.1; 430/270.1; 522/46; 522/65
(58) Field of Search ................. 430/270.1, 281.1, 430/311; 522/46, 65

(56) References Cited

U.S. PATENT DOCUMENTS

| | | | |
|---|---|---|---|
| 4,540,763 A | 9/1985 | Kirchhoff | 526/281 |
| 4,642,329 A | 2/1987 | Kirchhoff et al. | 526/284 |
| 4,698,394 A | 10/1987 | Wong | 525/289 |
| 4,708,990 A | 11/1987 | Wong et al. | 525/250 |
| 4,722,974 A | 2/1988 | Wong | 525/250 |
| 4,724,260 A | 2/1988 | Kirchhoff et al. | 546/112 |
| 4,731,418 A | 3/1988 | Dean | 525/205 |
| 4,766,180 A | 8/1988 | Wong | 525/289 |
| 4,783,514 A | 11/1988 | Kirchhoff et al. | 526/281 |
| 4,812,588 A | 3/1989 | Schrock | 556/453 |
| 4,826,997 A | 5/1989 | Kirchhoff | 548/546 |
| 4,968,754 A | 11/1990 | Wong | 525/295 |
| 4,973,636 A | 11/1990 | Corley | 526/262 |
| 4,978,719 A | 12/1990 | Wong | 525/275 |
| 4,988,770 A | 1/1991 | Wong | 525/244 |
| 4,999,499 A | 3/1991 | Bhatt | 250/342 |
| 5,136,069 A | 8/1992 | DeVries et al. | 556/453 |
| 5,157,105 A | 10/1992 | Corley et al. | 528/322 |
| 5,185,391 A | 2/1993 | Stokich, Jr. | 524/87 |
| 5,243,068 A | 9/1993 | DeVries et al. | 560/205 |
| 5,496,893 A | 3/1996 | Gagne et al. | 525/50 |
| 5,585,450 A | 12/1996 | Oaks et al. | 526/279 |
| 2002/0102495 A1 * | 8/2002 | Ohba et al. | |

FOREIGN PATENT DOCUMENTS

| | | |
|---|---|---|
| EP | 0527572 A1 | 2/1993 |
| JP | 04171796 | 6/1992 |
| JP | 8-60103 | 3/1996 |
| JP | 9-194549 | 7/1997 |
| JP | 09219586 | 8/1997 |

OTHER PUBLICATIONS

Czornyl, et al., *Microelectronic Packaging Handbook, vol. 2*, Chapter 11.
U.S. patent application Ser. No. 09/177,819, filed Oct. 23, 1998.
Strandjord, et al.; "A Photosensitive–BCB on Laminate Technology (MCM–LD)"; Proceedings of the Electronic Components and Technology Conference; New York, US; Conf. 44; May 1, 1994; pp. 374–386.
Fishback, et al., *J. Polym. Sci., Part A: Polym. Chem.* 31 (11), pp. 2747–2750, 1993.
H. T. Holden, *Printed Circuits Handbook*, 4th Ed., Chapter 4.
*Journal of Electronics Materials*, vol. 19, No. 12, 1990, "Benzocyclobutene dielectrics for the fabrication of high denisty, thin film multichip modules".
Research Disclosure #40552, "Method for the preparation of multilayer circuit board base plate", Jan. 1998, pp. 51–53.

* cited by examiner

*Primary Examiner*—Rosemary Ashton
(74) *Attorney, Agent, or Firm*—Susan Moeller Zerull

(57) ABSTRACT

The invention is a process for building-up printed wiring boards using metal foil coated with toughened benzocyclobutene-based dielectric polymers. The invention is also a toughened dielectric polymer comprising benzocyclobutene-based monomers or oligomers, ethylenically unsaturated polymer additive, and, optionally, a photoactive compound.

7 Claims, No Drawings

TOUGHENED BENZOCYCLOBUTENE BASED POLYMERS AND THEIR USE IN BUILDING-UP PRINTED WIRING BOARDS

This application is a Divisional of U.S. application Ser. No. 09/496,495, filed Feb. 2, 2000 now U.S. Pat. No. 6,420,093.

This invention was made with Government support under Agreement No. MDA972-95-3-0042 awarded by ARPA. The Government has certain rights in the invention.

FIELD OF THE INVENTION

This invention relates to a process for making additional interconnect layers on commercially available printed circuit boards using toughened benzocyclobutene based polymers and metal foils coated with such polymers. This invention also relates to such toughened benzocyclobutene-based polymers.

BACKGROUND OF THE INVENTION

Various printed wiring boards or printed circuit boards (referred to herein as "PWBs") are known and frequently have two to eight layers of laminates. Occasionally, it is desirable to add additional layers to these board structures (see, e.g., H. T. Holden, In Printed Circuits Handbook, 4$^{th}$ ed., C. F. Coombs, Jr., Ed.; McGraw-Hall: New York, 1996, Chapter 4). For high frequency applications, the insulating materials typically used in the PWBs (e.g., epoxy materials) may not provide the desired low dielectric loss. Therefore, it would be desirable to have a process and materials which could provide the desired low dielectric loss.

Benzocyclobutene-based polymers (hereinafter referred to as "BCB polymers") are thermosetting polymers. Certain of these polymers have low dielectric constants and thus, are desirable as insulating coatings in various electronics applications (see, e.g., "Benzocyclobutene(BCB) Dielectrics for the Fabrication of High Density, Thin Film Multichip Module," *Journal of Electronics Materials, Vol.* 19, No.12, 1990 and G. Czornyl, M. Asano, R. L. Beliveau, P. Garrou, H. Hiramoto, A. Ikeda, J. A. Kreuz and O. Rohde, In *Microelectronic Packaging Handbook, Volume* 2; R. R,.Tummala, E. J. Rymaszewski and A. G. Klopfenstein, Eds.; Chapman & Hall: New York, 1997; Chapter 11). However, for certain applications, BCB polymers may not have sufficient toughness. Therefore, it would be desirable to have a BCB polymer with increased toughness without significant loss or degradation of other desirable properties.

JP 8-60103 discloses an adhesive sheet comprises a compound having a benzocyclobutene group and a binder polymer. The preferred binder polymers have carbon-carbon unsaturated bonds. The reference indicates that from about 1–95 percent of the composition may be the binder polymer.

SUMMARY OF THE INVENTION

According to a first embodiment, the present invention is a process comprising
  providing a printed wiring core board, which comprises a glass fiber reinforced board with conductive metal circuitry,
  laminating to the printed wiring core board a sheet comprising a foil of a conductive metal and, on the foil, a dielectric layer of a curable composition comprising
    (a) at least one precursor compound selected from arylcyclobutene monomers, arylcyclobutene oligomers, and combinations thereof; and (b) a polymer or oligomer having a backbone comprising ethylenic unsaturation (i.e., carbon-to-carbon double bond(s)), wherein, during the lamination step, the dielectric layer is in contact with the printed wiring board, and
  processing the laminated article to form additional electrical connections.

According to a second embodiment, this invention is a preferred composition comprising
  a) at least one precursor compound selected from arylcyclobutene monomers, arylcyclobutene oligomers, and combinations thereof; and
  b) a polymer or oligomer having a backbone comprising ethylenic unsaturation (i.e., carbon-to-carbon double bond(s)) and terminal acrylate or methacrylate groups. The invention is also the partially polymerized (b-staged) reaction product of this composition and the cured reaction product of the b-staged material.

According to yet a third embodiment, the invention is a sheet comprising a metal foil and a film comprising the composition of the second embodiment or the partially cured product of that composition.

DETAILED DESCRIPTION OF THE INVENTION

The core board to which the BCB coated metal foil is laminated is characterized by having various insulating layers laminated together and separating various metal interconnect lines. Processes for making such PWBs are well-known (see, e.g., *Printed Circuits Handbook,* 4$^{th}$ Ed., C. F. Coombs, Jr., McGrall-Hill: New York, 1996). Typically, the insulating layers are glass reinforced epoxy. The metal foil is a very thin layer of a conducting metal, such as Cu or Cu alloy, and is preferably copper. The thickness of the metal foil is preferably about 3 to 50 microns. The BCB dielectric layer is preferably coated from a solvent onto foil. Suitable solvents include mesitylene xylenes, toluene, methyl ethyl ketone, cyclic ketones and a mixture of these solvents. After coating, the composition is preferably baked at temperatures from 100° C. to 200° C., more preferably 120° C. to 180° C. in air for 5 to 30 minutes, most preferably at 140° C. to 160° C. for 10 to 20 minutes.

Lamination to the core board may occur according to standard processes, preferably by vacuum hot press at temperatures of 200° C.–250° C. and pressures of 10–40 Kg/cm$^2$.

Additional patterning steps may then be performed to the laminate according to known procedures. For example, the metal foil could be stripped or pattern etched followed by via formation with a laser drilling (e.g. with a $CO_2$ laser), or the entire laminate could be mechanically drilled through. Electroless plating of additional conductive metal, such as copper, followed by electroplating (e.g. with copper) could be used to form the desired electrical connections.

As stated above, the precursor is either an arylcyclobutene monomer, a b-staged oligomer of one or more arycyclobutene monomers, or some combination of b-staged arylcyclobutene oligomers and/or monomers.

Preferably, the monomers are of the formula

wherein

B$^1$ is an n-valent organic linking group, preferably comprising ethylenic unsaturation, or B$^1$ is absent. Suitable single valent B$^1$ groups preferably have the formula —CR$^8$=CR$^9$Z, wherein R$^8$ and R$^9$ are independently selected from hydrogen, alkyl groups of 1 to 6, most preferably 1 to 3 carbon atoms, and aryl groups, and Z is selected from hydrogen, alkyl groups of 1 to 6 carbon atoms, aryl groups, —CO$_2$R$^7$ wherein R$^7$ is an alkyl group, preferably up to 6 carbon atoms, an aryl group, an aralkyl group, or an alkaryl group. Most preferably Z is —CO$_2$R$^7$ wherein R$^7$ is an alkyl group, preferably up to 6 carbon atoms, an aryl group, an aralkyl group, or an alkaryl group. Suitable divalent B$^1$ groups include —(CR$^8$=CR$^9$)$_o$—(Z')$_{o-1}$, wherein R$^8$ and R$^9$ are as defined previously, o is 1 or 2, and Z' is an alkyl group of 1 to 6 carbon atoms, an aromatic group, or a siloxane group. Most preferably o is 2 and Z' is a siloxane group.

Ar$^1$ is a polyvalent aromatic or heteroaromatic group and the carbon atoms of the cyclobutane ring are bonded to adjacent carbon atoms on the same aromatic ring of Ar$^1$, preferably Ar$^1$ is a single aromatic ring;

m is an integer of 1 or more, preferably 1;

n is an integer of 1 or more, preferably 2–4, more preferably 2; and

R$^1$ is a monovalent group, preferably hydrogen, lower alkyl of up to 6 carbon atoms.

The synthesis and properties of these cyclobutarenes, as well as terms used to describe them, may be found, for example, in U.S. Pat. Nos. 4,540,763; 4,724,260; 4,783,514; 4,812,588; 4,826,997; 4,999,499; 5,136,069; 5,185,391; 5,243,068, all of which are incorporated herein by reference.

According to one preferred embodiment, the monomer (a) has the formula

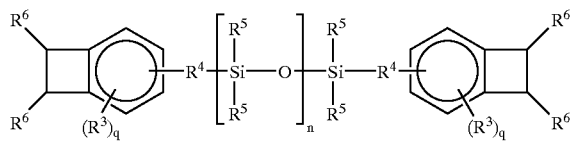

wherein each R$^3$ is independently an alkyl group of 1–6 carbon atoms, trimethylsilyl, methoxy or chloro; preferably R$^3$ is hydrogen;

each R$^4$ is independently a divalent, ethylenically unsaturated organic group, preferably an alkenyl of 1 to 6 carbons, most preferably —CH$_2$=CH$_2$—;

each R$^5$ is independently hydrogen, an alkyl group of 1 to 6 carbon atoms, cycloalkyl, aralkyl or phenyl; preferably R$^5$ is methyl;

each R$^6$ is independently hydrogen, alkyl of 1 to 6 carbon atoms, chloro or cyano, preferably hydrogen;

n is an integer of 1 or more;

and each q is an integer of 0 to 3.

The preferred organosiloxane bridged bisbenzocyclobutene monomers can be prepared by methods disclosed, for example, in U.S. Pat. Nos. 4,812,588; 5,136,069; 5,138,081 and WO 94/25903. The preferred compound where n is 1, q is 0, R$^4$ is —C=C—, R$^5$ is methyl, and R$^6$ is hydrogen is referred to herein as DVS-bisBCB.

If an oligomeric precursor is desired, the BCB monomers may be b-staged according to any known process. The monomers may be partially polymerized or b-staged neat (i.e., without solvent) by heating (see, e.g., U.S. application Ser. No. 08/290,197 and U.S. Pat. No. 4,642,329, incorporated herein by reference). Alternatively, the monomers may be partially polymerized or b-staged in a solvent (see, e.g., U.S. application Ser. No. 08/290,197, incorporated herein by reference). When oligomeric precursors are used, the weight average molecular weight (Mw) is preferably less than 200,000, more preferably less than 150,000 and preferably greater than 10,000, more preferably greater than 20,000.

The second component having the ethylenic unsaturation in the carbon backbone should be selected so that it can withstand the processing conditions (solvents, heating, etc.) used in microelectronics fabrication and not cause a significant deterioration in the electrical insulating properties of the reaction product relative to an unmodified BCB polymer. Suitable materials include polymers based on butadiene, isoprene, ethylene-butene, and ethylene-propylene. Comonomeric units, such as styrene and methylstyrene, may also be used. Preferably, the ethylenically unsaturated polymer is selected from polybutadiene, polyisoprene, styrene-butadiene block copolymers, and styrene-isoprene block copolymers. Applicants have found that the terminal groups on the ethylenically unsaturated polymer can have a profound effect on the performance of the composition. Acrylate or methacrylate terminated polymers are the preferred materials, as recited in the second embodiment of this invention, with acrylate terminated polybutadienes being the more preferred. The most preferred polymer has the formula

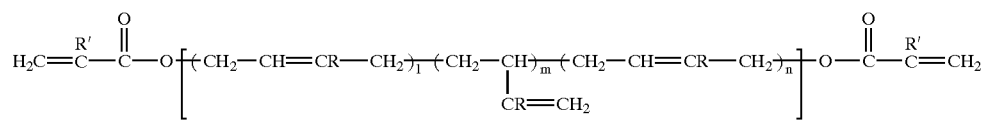

wherein l, m and n represent the mole fraction of the respective group in the polymer and (l+n) is from about 0.4 to about 0.95 and m is from about 0.05 to about 0.6, R and R' are independently in each occurrence alkyl groups of 1 to about 10 carbon atoms, and preferably are methyl groups.

The molecular weight (Mw) of the second component is preferably less than 150,000, more preferably less than 100,000, most preferably less than 80,000, and preferably greater than 3,000, more preferably greater than 5,000.

The amount of the second component used in the composition should be such as to avoid excessive phase separation between the first and second components. When phase separation occurs significantly, it depends upon various factors, such as the molecular weights of the components, the characteristics and relative amounts of any comonomers, the solvents used, and the temperature of processing. Preferably, the amount of the second component is less than 50 parts per hundred parts of the arylcyclobutene material (phr). For the composition of the second embodiment (the preferred composition having acrylate terminal groups), the second component is preferably present in amounts of at least 20 phr to give the maximum combination of toughness, flexibility and dimensional stability. For other non-preferred embodiments, the amount of the second component is preferably less than 15 phr to avoid phase separation and solubility problems.

The composition may be cured by any known method, such as, for example, by heating to temperatures from 200° C. to 300° C. Frequently, the composition is coated on a substrate (e.g., by spin coating, or drawing with a bar) to yield a film, and dried and cured by heating.

If desired, a photosensitive compound may be added to render the composition photosensitive. A coated film of the composition can then be patterned by exposure to activating wavelengths of radiation. Photosensitizers that increase the photoactive compound's photosensitivity may also be added. Any photoactive compounds and photosensitizers that are known in the art may be used. Examples of photoactive compounds include bisazides, a combination of bismaleimides, acrylates, acetylenes, and radical initators such as 2,2-dimethoxy-2-phenylacetophenone. The amount of photoactive compound is preferably 0.1 percent to 20 percent by weight, more preferably about 0.5 percent to 8 percent, based on total weight of components a and b and the photoactive compound. See U.S. application Ser. No. 08/290,197, incorporated herein by reference, for additional discussion regarding photocurable BCB compositions and methods of developing such compositions. See also U.S. Ser. No. 09/177,819, incorporated herein by reference.

Flame retardant compounds may be added to render the flame retardancy. Examples of flame retardant compounds include phosphate compounds, such as triphenylphosphate and trishaloethyl phosphate, halogenated compounds, such as polymerized tetrabromo-bis-phenol A and inorganic compounds such as magnesium and calcium carbonate. Multiple flame retardant compounds can be used to enhance the flame retardant effect. The amount of flame retardant compound is preferably 5 percent to 20 percent by weight, more preferably about 5 percent to 10 percent, based on total weight of components a and b and the photoactive compound.

Other components, such as antioxidants (e.g., quinolines, hindered amines, monomethyl ether hydroquinone, and 2,6-di-tert-butyl-4-methylphenol), adhesion promoters, additional cross-linkers (e.g., 2,6-bis(4-azidobenzylidene)-4-ethylcyclohexanone) (BAC-E) that are known in the art may also be included in the composition. Using additional cross-linkers that are reactive to BCB under dry, heated conditions are advantageous for the metal-coated foils because they enable one to control resin flow during the lamination process.

Suitable solvents for the composition include mesitylene, xylenes, toluene, methyl ethyl ketone, cyclic ketones and mixture of these.

EXAMPLES

Structures and information of polystyrene-polybutadiene-polystyrene (SBS) triblock copolymer (VECTOR from Dexco), dihydroxyl terminated polybutadiene (R45HT from Elf-Atochem) and diacrylate terminated polybutadiene (BAC-45 from Osaka Organic Chemical Industry, Inc.) used in some of the examples are listed below:

VECTOR 8505: styrene/diene ratio=29/71; Mw ca 75,000 g/mol.
VECTOR 6241: styrene/diene ratio=43/57; Mw ca 62,000 g/mol.

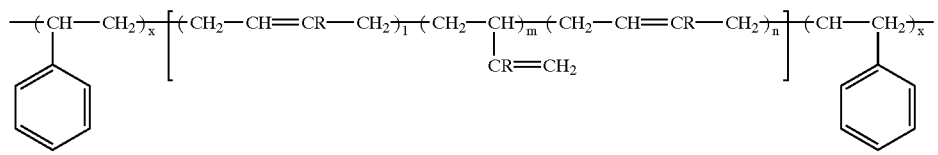

(l+n)=95 to 50 percent
m=5 to 50 percent
R45HT:
Mw ca. 6,200 g/mol.; Mn ca. 2,800 g/mol.

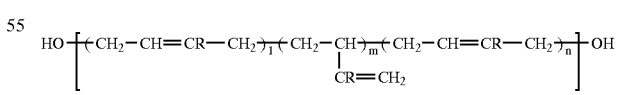

BAC-45:
Mw ca. 6,600 g/mol; Mn ca. 3,000 g/mol

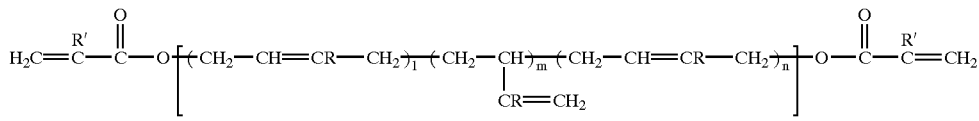

Example 1

The ethylenically unsaturated elastomers listed below were evaluated for their usefulness in modifying formulations comprising benzocyclobutene oligomers:

TABLE I

Liquid Polybutadiene

| Manufacturer | Product Name | Chemistry | Mn | Cis & Trans % |
|---|---|---|---|---|
| Japan Petrochemical | B-700 B-1000 B-2000 B-3000 | Allyl terminated polybutadiene | 700 1000 2000 3000 | 30% |
| Huls | POLYOIL 110 | | 3000 | 99% |
| Idemitsu | POLY BD R45HT | Hydroxy terminated polybutadiene | 2900 | 80 |
| Petrochemical | POLY BD R15HT | | 1200 | 80 |
| Osaka Organic Chemical | BAC-45 | Methacrylate terminated polybutadiene | 2900 | 80 |

TABLE II

SBS Elastomer

| Manufacturer | Product Name | Mw | Styrene/Diene Ratio |
|---|---|---|---|
| Dexco | VECTOR 6030 | 145,000 | 30/70 |
| | VECTOR 2518 | 100,000 | 31/69 |
| | VECTOR 8508 | 75,000 | 29/71 |
| | VECTOR 6241 | 62,000 | 43/57 |

The compatibility of these materials in a polymer based on the DVS-bisBCB monomer is shown in the following table:

TABLE III

Compatibility of Elastomer to BCB

| Manufacturer | Product Name | Solubility to 50% BCB Polymer (Mw = 140,000) Solution in Mesitylene | Maximum Add-in Level Without Bleedout Phenomena by Thermal Cure Process |
|---|---|---|---|
| Japan Petrochemcal | B-700 | >30 phr | 15 Phr |
| | B-1000 | >30 | 15 |
| | B-2000 | >30 | 10 |
| | B-3000 | >30 | <10 |
| Huls | POLYOIL 110 | >30 | 10 |
| Idemitsu | POLY BD R45HT | >30 | 10 |
| Petrochemical | POLY BD R15HT | 10 | 15 |
| Osaka Organic Chemical | BAC-45 | >30 | >30 |
| Dexco | VECTOR 6030 | <4 phr | — |
| | VECTOR 2518 | <4 phr | — |
| | VECTOR 8508 | 5 phr | >20 phr |
| | VECTOR 6241 | 10 phr | >20 phr |

The various elastomers in combination with the BCB polymer were further evaluated for tackiness, amount of curl experienced when coated onto a copper foil and for bend flexibility of the coated copper foil as shown below:

TABLE IV

B-Stage Polymer Film Evaluation

| Manufacturer | Product Name | Add-in Level to Mw140K BCB | Tackiness and Cu Foil Curl | Bend Flexibility (Bending Radius at Cracking) |
|---|---|---|---|---|
| Japan Petrochemcal | B-700 | 15 Phr | OK | R = 20 mm |
| | B-1000 | 15 Phr | OK | R = 20 mm |
| | B-2000 | 10 Phr | OK | R = 20 mm |
| | B-3000 | 5 Phr | OK | R = 50 mm |
| Huls | POLYOIL 110 | 10 Phr | OK | R = 10 mm |
| Idemitsu | POLY BD R45HT | 10 Phr | OK | R = 10 mm |
| Petrochemical | POLY BD R15HT | 10 Phr | OK | R = 10 mm |
| Osaka Organic Chemical | BAE-45 | 20 Phr | OK | R = 0.5 mm |
| Dexco | VECTOR 8508 | 5 Phr | Curl | R > 100 mm |
| | VECTOR 6241 | 10 Phr | Curl | R > 100 mm |
| Dow | BCB monomer | 20 Phr | OK | R = 20 mm |

The coated copper foils were then cured or C-staged and further evaluation of toughness of the cured composition occurred as shown below:

TABLE V

C-Stage Polymer Film Evaluation

| Manufacturer | Product Name | Add-in Level to Mw140K BCB | Knife Scribe Test (Toughness) * |
|---|---|---|---|
| Japan Petrochemcal | B-700 | 15 Phr | 1 |
| | B-1000 | 15 Phr | 1 |
| | B-2000 | 10 Phr | 1 |
| | B-3000 | 5 Phr | 1 |
| Huls | POLYOIL 110 | 10 Phr | 3 |
| Idemitsu | POLY BD R45HT | 10 Phr | 3 |
| Petrochemical | POLY BD R15HT | 10 Phr | 3 |

TABLE V-continued

C-Stage Polymer Film Evaluation

| Manufacturer | Product Name | Add-in Level to Mw140K BCB | Knife Scribe Test (Toughness) * |
|---|---|---|---|
| Osaka Organic Chemical | BAC-45 | 20 Phr | 5 |
| Dexco | VECTOR 8508 | 5 Phr | 3 |
|  | VECTOR 6241 | 10 Phr | 3 |
| DOW | BCB monomer | 20 phr | 1 |

* Rating: 1 poor–5 excellent

Example 2

Polymer Coated Cu Foil with 15% BAC-45 in Mw of 140,000 g/mol. BCB

Eighty weight parts of B-staged BCB (Mw=140,000 g/mol.), 15 weight parts of BAC-45, and 1 part of bis-azide cross-linker were blended in 100 parts of mesitylene. The solution was clear. The solution was coated on the matte side of a 0.5 oz. Cu foil with a doctor blade that had a 200 $\mu$m gap between the blade and the Cu foil surface so that the thickness of the dry-up BCB film was 100 $\mu$m. After coating, the polymer coated Cu foil was placed in a 150° C. oven for 15 minutes to evaporate the solvent. The B-stage polymer coated Cu foil was not coiled, and it generated no cracks in the bending test with 10 mm diameter cylindrical spacer.

The B-stage polymer coated Cu foil was laid up on a 1.6 mm thick and 30 cm×30 cm FR-4 laminate board whose Cu circuit had black oxide surface. The set was placed in a vacuum hot press machine. The hot press was programmed so that temperature was ramped at 5° C. per minute to 210° C. and was kept for 3 hours. The hot press pressure was maintained at 10 Kg/cm$^2$ until the temperature went-up to 170° C. and then was increased to 30 Kg/cm$^2$ and maintained until the press program finished. The post-press thickened polymer layer built on FR-4 core board was approx. 80 $\mu$m+/−10 $\mu$m. The board was cut into 1 inch by 4 inch strips for Cu foil peel strength measurement. The Cu peel strength was approximately 1.0 Kg/cm and no BCB delamination from core board was observed.

Also, the board was cut into 2 inch by 2 inch pieces and the pieces were placed under a pressure cooker test (121° C. for 3 hours) and then dipped in a 260° C. solder bath for 1 minute. No blister was observed.

Example 3

Polymer Coated Cu Foil with 5% BAC-45 and 10% BCB Monomer in Mw of 140,000 g/mol. BCB Ninety weight parts of B-stage BCB (Mw=140,000 g/mol.), 5 weight parts of BAC-45, 5 weight parts of BCB monomer and 1 part of bis-azide cross-linker were blended in 100 parts of mesitylene. The solution was clear. The polymer solution was coated on a Cu foil and thermally dried in the same manner as Example 2. Then, the polymer coated Cu foil was laminated in the same manner as Example 2.

The post-press thickness polymer layer built on FR-4 core board was 80 $\mu$m+/−10 $\mu$m. The board was cut into 1 inch by 4 inch strips for Cu foil peel strength measurement. The Cu peel strength was approximately 0.9 Kg/cm$^2$ and no BCB delamination from core board was observed. Also, the board was cut into 2 inch by 2 inch pieces and the pieces were placed in a pressure cooker test (121° C. for 3 hours) and then dipped in a 260° C. solder bath for 1 minute. No blister was observed.

Example 4

Flexible Metalized Sheet with 30% BAC-45 in Mw of 140,000 g/mol. BCB

Seventy weight parts of B-stage BCB (Mw=140,000 g/mol.), 30 weight parts of BAC-45 and 3 parts of bis-azide cross-linker were blended in 100 parts of mesitylene. The solution was clear. The polymer-coated solution was coated on the shiny side of a ¼ oz. Cu foil and thermally dried in the same manner as Example 2. The coating thickness was 100 $\mu$m. Then, polished stainless steel plate was laid upon the polymer side of the polymer coated Cu foil, and hot-pressed in the same manner as Example 2. After the hot press process, the polymer coated Cu foil was peeled off from the stainless steel plate. The post-pressed polymer layer thickness was 100 $\mu$m. The polymer sheet was subjected to bending test with 1 mm thick spacer. No crack occurred.

Example 5

Glass Reinforced Substrate with 15% BAC-45 in Mw of 140,000 g/mol. BCB

Eighty weight parts of B-stage BCB (Mw=140,000 g/mol.), 15 weight parts of BAC-45, and 1 part of bis-azide cross-linker were blended in 120 parts of mesitylene. The solution was clear. The polymer solution was coated on and impregnated into a glass mat (Ohji Paper's Glassper) GMC-50E, thickness=380 $\mu$m) which was thermally dried at 150° C. for 30 minutes to make a prepreg. The resin content of the prepreg was approximately 90 percent. Three sheets of the prepreg were laid-up and Cu foil sheets were placed on top and bottom. Then, the set of prepreg sheets and 0.5 oz. Cu foil sheets were placed in a vacuum hot press. The hot press was programmed so that the temperature was ramped at 5° C./minute to 250° C. and was kept for 3 hours. The hot press pressure was maintained at 10 Kg/cm$^2$ until the temperature went up to 170° C. and then was increased to 30 Kg/cm$^2$ and maintained until the press program was finished. The post-hot press thickness was 1.1+/−0.01 mm. The board was cut into 1 inch by 4 inch strips for Cu foil peel strength measurement. The Cu peel strength was approximately 0.9 Kg/cm$^2$ and no BCB delamination from core board was observed.

The board was cut into 2 inch by 2 inch pieces and the pieces were placed under a pressure cooker test (121° C. for 3 hours) and then dipped in a 260° C. solder bath for 1 minute. No blister was observed.

Example 6

Preparation of 10% R45HT (Hydroxy Terminated Polybutadiene) in B-Staged BCB with Mw of 140,000 g/mol.

Five hundred grams of 51.2% BCB in mesitylene solution was mixed with 28.5 grams of R45HT. One hundred grams of the above solution were diluted with 11.4 grams of mesitylene to generate a solution with 43.5% BCB and 4.84% R45HT. The solution was spin-coated on a 6 inch Cu coated wafer at 3000 rpm. Cure program was from RT to 150° C. in 30 minutes, at 150° C. for 20 minutes, from 150 to 250° C. in 40 minutes and at 250° C. for 1 hour. The film surface had a "scale" pattern which could be due to migration of R45HT to the surface during cure. The coefficient of thermal expansion (CTE) of a free-standing film is 94 ppm/°C.

Example 7

Preparation of 10% BAC-45 (Acrylate Terminated Polybutadiene) in B-Staged DVS-bisBCB (BCB) with Mw of 140,000 g/mol.

One hundred grams of 51.2% BCB in mesitylene was mixed with 5.8 g of BAC-45 and 7 grams of mesitylene. The solution contained 45.5% BCB and 5.14% BAC-45. A film was spin-coated and curved as in Example 6. The surface of the film was smooth. A portion of the film was freed from the wafer by etching off the copper with a 10% ammonium persulfate solution. Examination of the free-standing film by transmission electron microscopy (TEM) did not show any discrete domains. CTE of a free-standing film is 80 ppm/$\mu$C.

Example 8

Preparation of 20% BAC-45 in B-Staged DVS-bisBCB (BCB) with Mw of 140,000 g/mol.

One hundred and thirty-three grams of 51.2% BCB in mesitylene was mixed with 17.1 grams of BAC-45 and 15 grams of mesitylene. The solution contained 41.3% BCB and 10.4% BAC-45. A film was spin-coated and cured as in Example 6. The surface of the film was smooth.

Example 9

Thin Film from 10% VECTOR 6241 in B-Staged DVS-bisBCB (BCB) with Mw of 140,000 g/mol.

Fifty grams of 51.2% BCB in mesitylene was mixed with 2.85 grams of VECTOR 8508 and 3 grams of mesitylene. The solution contained 46.0% BCB and 5.1% VECTOR 6241. A film was spin-coated on a 6 inch copper coated wafer at 4000 rpm and cured. The surface of the film was smooth. A free-standing film was generated as in Example 7. Examination of the free-standing film by transmission electron microphotography (TEM) showed domains of about 0.2 $\mu$m diameter.

Example 10

Thin Film from 3.9% VECTOR 8508 in B-Staged DVS-bisBCB (BCB) with Mw of 140,000 g/mol.

Seven hundred and fifty grams of 50.9% BCB in mesitylene was mixed with 15.3 grams of VECTOR 8508 and 60 grams of toluene. The solution was spin-coated on a 4 inch copper coated wafer at 2500 rpm. A free-standing film was examined by TEM and the domains of about 0.2 $\mu$m diameter were observed.

Example 11

Patterning Thin Film of BCB with 10% BAC-45

To 15 grams of CYCLOTENE (trademark of The Dow Chemical Co.), 4026–46 dielectric was added 0.77 grams of BAC-45. A 0.3 weight percent partially hydrolyzed vinyl triacetate silane solution was applied to a 4 inch silicone wafer as adhesion promoter. The CYCOTENE 4026 solution with BAC-45 was spread at 500 rpm followed by spin-coating at 2700 rpm for 30 seconds. The wafer was prebaked at 85° C. for 90 seconds on a hot plate. A Karl Suss photo exposure tool was used with the gap between the wafer and the mask to be 10 $\mu$m. Exposure dose was 600 mJ/cm$^2$. Predevelopment bake was 50° C. for 30 seconds. The wafer was puddle developed with DS-2100, which is a mixture of PROGLYDE DMM (dipropylene glycol dimethyl ether from The Dow Chemical Co.) and Isopar L (from Exxon). The development time was 22 seconds. The wafer was cured and then treated with plasma. Final film thickness was 10.9 $\mu$m. All 75 $\mu$m vias were open.

Example 12

Patterning Thin Film of BCB with 10% R45HT

To 15 grams CYCLOTENE 4026–46 was added 0.77 gram of R45HT. A 0.3 weight percent partially hydrolyzed vinyl triacetate silane solution was applied to a 4 inch silicone wafer as adhesion promoter. The CYCLOTENE 4026 solution with R45HT was spread at 500 rpm followed by spin-coating at 2700 rpm for 30 seconds. The wafer was prebaked at 85° C. for 90 seconds on a hot plate. A Karl Suss photo exposure tool was used with the gap between the wafer and the mask to be 10 $\mu$m. The exposure dose was 600 mJ/cm$^2$. The predevelopment bake was 50° C. for 30 seconds. The wafer was puddle developed with DS-2100. The development time was 22 seconds. The wafer was cured and then treated with plasma. Final film thickness was 10.3 $\mu$m. The shape of the vias was distorted. Cracks were observed around the vias.

Example 13

Patterning Thin Film of BCB with 10% VECTOR 6241

To 100 grams CYCLOTENE 4026–46 was added 5.13 grams of VECTOR 6241 dissolved in 9.2 grams of mesitylene. A 0.3 weight percent partially hydrolyzed vinyl triacetate silane solution was applied to a 4 inch silicone wafer as adhesion promoter. The CYCLOTENE 4026 solution with VECTOR 6241 was spread at 500 rpm followed by spin-coating at 2500 rpm for 30 seconds. The wafer was prebaked at 85° C. for 90 seconds on a hot plate. A Karl Suss photo exposure tool was used with the gap between the wafer and the mask to be 10 $\mu$m. Exposure dose was 600 mJ/cm$^2$. Predevelopment bake was 50° C. for 30 seconds. The wafer was puddle developed with DS-2100. The development time was 34 seconds. The film became hazy after development. The wafer was cured and then treated with plasma. The final thickness of the hazy film was 7.6 $\mu$m.

Example 14

Tensile Properties of BCB with VECTOR 8508, R45HT and BAC-45

Strips of BCB with 5% and 10% VECTOR 8508, R45HT, and BAC-45 were generated and tested according to the procedure described by J. Im, et al. at 2$^{nd}$ International Symposium of Advanced Packaging Materials in Atlanta, Ga, March 1996. The results are shown in the table below.

TABLE VI

Tensile Properties of BCB with VECTOR 8508, R45HT and BAC-45

| Elastomer in BCB | Elastomer Content | Tensile Modulus (Gpa) | Strength (Mpa) | Strain (%) |
|---|---|---|---|---|
| VECTOR 8508 | 5% | 2.6 | 81 | 7.5 |
|  | 10% | 2.6 | 89 | 12.5 |
| R45HT | 5% | 2.7 | 85 | 11.0 |
|  | 10% | 2.5 | 77 | 8.5 |
| BAC-45 | 5% | 2.7 | 94 | 13.5 |
|  | 10% | 2.4 | 90 | 18.0 |

Example 15

A solution from 2.08 grams VECTOR 8508 SBS triblock copolymer was dissolved in 4 grams of mesitylene and 100 grams of B-staged BCB with Mw of 140,000 g/mol. and consisted of 50.9 weight percent BCB in mesitylene and was made photosensitive by using BAC-E (defined on p. 8) (1.85 grams, 3.5 weight percent) as photo cross-linker. To a 4 inch diameter wafer was applied a 0.3 weight percent partially hydrolyzed vinyl triacetate silane as adhesion promoter. BCB photo formulation was spread at 500 rpm for 10 seconds followed by spin-coating at 5000 rpm for 30 seconds. The wafer was prebaked on a hot plate at 90° C. for 90 seconds. A Karl Suss photo exposure tool was used and the gap between the wafer and the mask was 10 $\mu$m. The exposure dose was 413 mJ/cm$^2$. The wafer was puddle developed with DS 2100. Development time was 156 seconds. The developed wafer was baked on a hot plate at 90° C. for 90 seconds before it was cured at 250° C. under nitrogen. The cured wafer was treated with plasma for 45 seconds. Final film thickness was 10.5 $\mu$m. The thickness after bake was 12.7 $\mu$m. The film retention was 83%. All 50 $\mu$m vias were open with bottom of via at 38 to 41 $\mu$m.

Example 16

VECTOR 8508 SBS (2.1 grams), DVS-bisBCB monomer (52.9 grams) and mesitylene (145 grams) were heated at 165° C. under nitrogen until Mw of BCB reached 83,000 g/mol. Mw was measured by GPC. Measurement included BCB and SBS. The solution was filtered with 1 $\mu$m filter and concentrated to 39% by weight of BCB. BAC-E (283 mg, 3.5 wt. percent) was added to 20 grams of the BCB/SBS rubber solution. A 0.3 weight percent partially hydrolyzed vinyl triacetate silane was applied to a 4 inch wafer as adhesion promoter. BCB/SBS rubber/BAC-E solution was spread at 500 rpm followed by spin-coating at 2000 rpm for 30 seconds. The wafer was prebaked at 90° C. for 90 seconds on a hot plate. A Karl Suss photo exposure tool was used with the gap between the wafer and the mask to be 10 $\mu$m. The exposure dose was 1000 mJ/cm$^2$. The wafer was puddle developed with DS-2100. Development time was 73 seconds. The developed wafer was baked on a hot plate at 90° C. for 90 seconds before it was cured at 250° C. under nitrogen. The cured wafer was treated with plasma for 30 seconds. The final film thickness was 9 $\mu$m. Film thickness after bake was 11 $\mu$m. Film retention was 82%. All 75 $\mu$m vias were open.

What is claimed is:

1. A curable composition comprising:
   a) at least one precursor compound selected from arylcyclobutene monomers, arylcyclobutene oligomers, and combinations thereof; and
   b) a polymer or oligomer having a backbone comprising ethylenic unsaturation and terminal acrylate or methacrylate groups.

2. The composition of claim 1 wherein the ethylenically unsaturated polymer or oligomer is a polybutadiene.

3. The composition of claim 1 further comprising a cross-linking aid and an antioxidant.

4. An article comprising a metal foil and on that metal foil a layer of the composition of claim 1.

5. The article of claim 4 wherein the metal foil is copper.

6. The cured reaction product of the composition of claim 1.

7. A photoimageable composition comprising (a) at least one precursor compound selected from arylcyclobutene monomers, arylcyclobutene oligomers, and combinations thereof; (b) a polymer or oligomer having a backbone comprising ethylenic unsaturation; and (c) a photoactive compound selected from the group consisting of azides, bismaleimides, acrylates, acetylenes, isocyanates, aromatic ketones such as 2,2-dimethoxy-2-phenyl acetophenone, conjugated aromatic ketones, and benzophenone-containing polymers.

* * * * *